US007733126B1

(12) United States Patent
Choy et al.

(10) Patent No.: US 7,733,126 B1
(45) Date of Patent: Jun. 8, 2010

(54) NEGATIVE VOLTAGE GENERATION

(75) Inventors: Jon Choy, Austin, TX (US); David W. Chrudimsky, Austin, TX (US); Padmaraj Sanjeevarao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/415,159

(22) Filed: Mar. 31, 2009

(51) Int. Cl.
*H03K 19/0175* (2006.01)
(52) U.S. Cl. .......................................... 326/68; 326/81
(58) Field of Classification Search .................. 326/26, 326/27, 63–74, 80–83, 86
See application file for complete search history.

(56) References Cited

U.S. PATENT DOCUMENTS

| | | | |
|---|---|---|---|
| 6,229,379 B1 | 5/2001 | Okamoto | |
| 6,240,027 B1 * | 5/2001 | Lee et al. | 365/189.11 |
| 6,242,962 B1 | 6/2001 | Nakamura | |
| 6,483,366 B2 | 11/2002 | Ho | |
| 6,864,718 B2 * | 3/2005 | Yu | 326/68 |
| 7,268,588 B2 | 9/2007 | Sanchez et al. | |

* cited by examiner

*Primary Examiner*—Don P Le
(74) *Attorney, Agent, or Firm*—David G. Dolezal; James L. Clingan, Jr.

(57) ABSTRACT

A first logic state is at a first output voltage level at a first output of a level shifter that selects a first negative regulation voltage level in response to the first logic state. A negative supply voltage begins at first potential and decreases to the first negative regulation voltage level. The first output voltage level decreases as the negative supply voltage decreases. The first output of the level shifter is switched from the first logic state to a second logic state in response to the negative supply voltage reaching the first negative regulation voltage level. The second logic state is provided at a second output voltage level that selects a second negative regulation voltage level for the negative regulation voltage. The first output of the level shifter remains at the second logic state but is reduced in voltage.

20 Claims, 4 Drawing Sheets

NEGATIVE VOLTAGE GENERATION

BACKGROUND OF THE INVENTION

1. Field of the Invention

This invention relates in general to electronic circuits and more specifically to negative voltage generation in electronic circuits.

2. Description of the Related Art

Negative voltages are utilized in electronic circuits. For example, a negative voltage is utilized in a programmable memory for erasing non volatile memory cells. Generating negative voltages for electronic circuits may present challenges for circuit designers in that the gate oxide of devices used to generate the negative voltages are susceptible to being over stressed.

FIG. 1 is a circuit diagram of a prior art level shifter. Level shifter 101 includes inverters 103, 107, 111, and 116, NAND gates 105, 109, and 114, P-channel transistors 115, 117, 119, and 121, and N-channel transistors 123 and 125. P-channel transistors 115, 117, 119, and 121, and N-channel transistors 123 and 125 form a latch circuit 113.

In operation, level shifter 101 takes a voltage at its input (IN) and latches the same logic state at its output (OUT). In one example, the IN signal has a voltage signal range of 0 to 3.3V and OUT signal has a voltage signal range of Vneg to 3.3 Volts. After the value is latched, the Vneg voltage is lowered from 0 volts to a negative value (e.g. −4 Volts) while maintaining the logic state of the output. After the voltage level has been lowered, a protection mode (PM) signal is asserted which causes the output of inverters 111 and 116 to both be driven to the voltage level of their low voltage rails (e.g. 0 Volts). With the assertion of the PM signal, the "high" logic voltage level of the output (OUT) drops from 3.3 voltage to 0 Volts (the value of the low voltage negative rail of inverters 111 and 116) while still maintaining the logic state. Afterwards, Vneg is reduced to a lower voltage level. With this circuit, once Vneg is lowered, the output cannot change logic states.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

A circuit for generating negative voltages for an electronic circuit is described herein. In one example, negative voltages are generated with a level shifter that can change logic states after the low logic voltage level of its output has been lowered. This allows for logic circuitry to operate and change states when the negative voltage is at an intermediate negative value. With this configuration, a charge pump can be regulated to produce both an intermediate regulated negative voltage level and a final regulated negative voltage level with a negative voltage that is generated by the circuit as a voltage input as opposed to using an additional negative voltage source as a voltage input.

Figure 1:
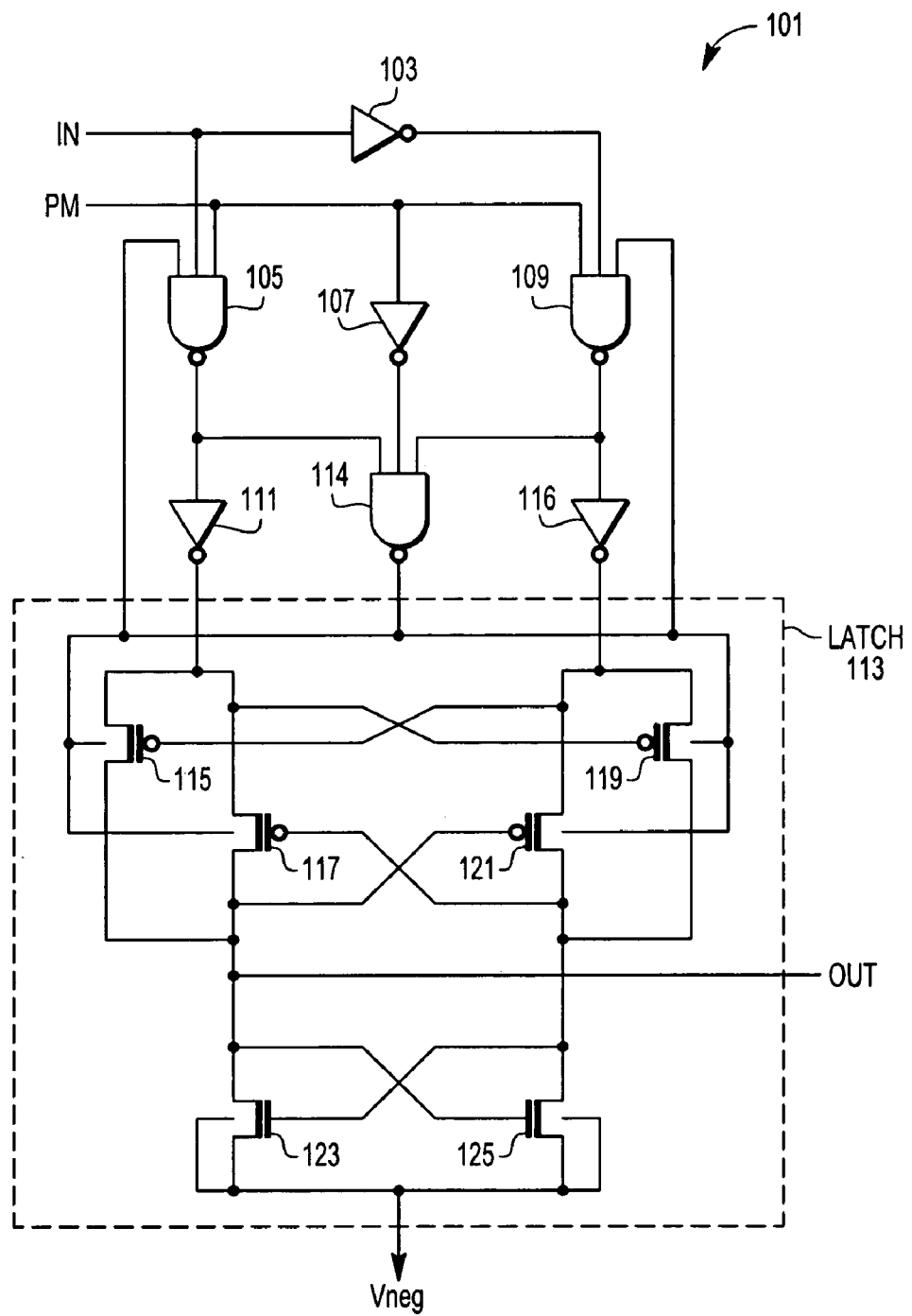
FIG. 1 is a circuit diagram of a prior art level shifter.
Figure 2:
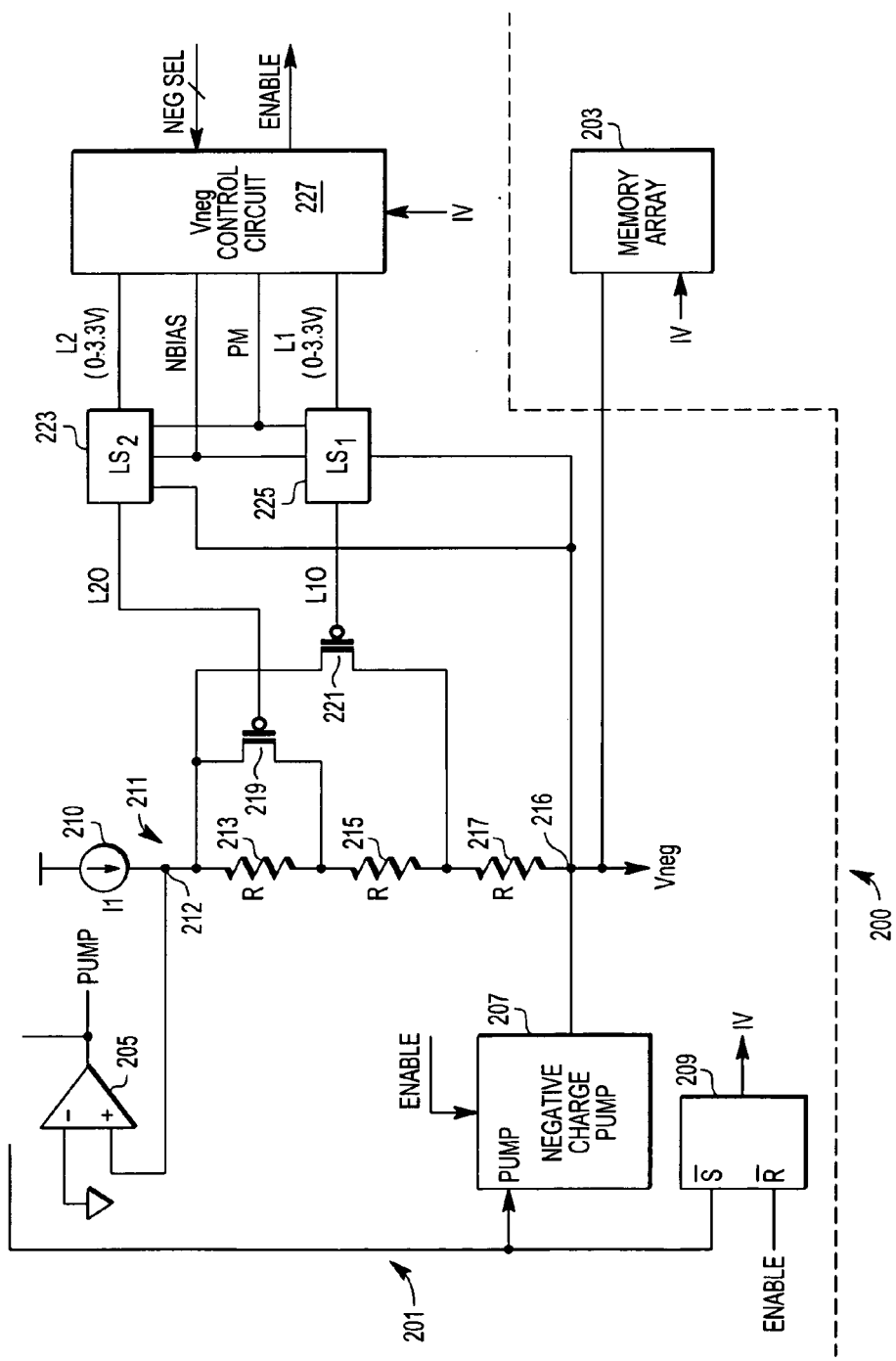
FIG. 2 is a circuit diagram of a portion of an electronic circuit according to one embodiment of the present invention.

FIG. 2 is a diagram of an electronic circuit according to one embodiment of the present invention. In the embodiment shown, electronic circuit 200 includes a negative voltage generation circuit 201 and a memory array 203 that utilizes the generated negative supply voltage (Vneg) for memory operation. In one embodiment, array 203 utilizes Vneg as a voltage reference for generating a negative voltage to erase non volatile memory cells of array 203. However, in other embodiments, memory array 203 may be another type of memory and/or use the negative voltage in other ways. Also, in other embodiments, electronic circuit 200 may be or include other types of circuits that use Vneg such as operational amplifiers and analog to digital converters.

Circuit 201 includes a negative charge pump 207 that drives its output at a negative potential thereby lowering the voltage of Vneg. In one embodiment, pump 207 is a Dickson type charge pump. Pump 207 is enabled by an enable signal. When enabled, charge pump generates negative charge when a PUMP signal is asserted. Circuit 201 includes a comparator and a current path 211 for controlling the assertion of the PUMP signal. Path 211 includes a current source 210, and resistors 213, 215, and 217 which are coupled in series with node 216. During operation, comparator compares the voltage of node 212 with a ground potential to determine whether to assert the PUMP signal. In one embodiment, the resistors are implemented as "diode connected" transistors. In other embodiments, they may be implemented as poly resistors.

Circuit 201 includes bypass transistors 219 and 221 for providing paths for bypassing resistors in path 211 to selectively set the regulated voltage level of Vneg during operation.

The conductivity of bypass transistors 219 and 221 are controlled by level shifters 223 and 225, respectively. Level shifters 223 and 225 are capable of shifting the upper logic voltage level and lower logic voltage level of their outputs during operation. Also, level shifter 223 and 225 are capable of switching logic states when the lower logic voltage level has been switched from a ground potential to a negative voltage level.

Level shifters 223 and 225 each receive an input signal (L2 and L1) from Vneg control circuit 227 for controlling the transistor conductivity states of transistors 219 and 221 respectively. Signals L1 and L2 have an upper logic voltage level of 3.3 Volts indicative of a non conductive logic state and a lower logic voltage level of 0 volts indicative of a conductive logic state. The voltage levels of the conductive and non conductive logic states are associated with conductive state and non conductive state voltage levels of the gate electrodes of P-channel transistors 219 and 221.

Vneg control circuit 227 generates the L1 and L2 signals during the operation of circuit 201. The voltage level of the L2 signal during operation is based upon the desired final negative voltage level of Vneg. This value is provided to circuit 227 by the NEG SEL signal, which in one embodiment is provided from electronic device control circuitry (not shown). When transistor 219 is not conductive (and transistor 221 is not conductive as well), Vneg is regulated at a lower voltage level (a more negative voltage level) than when transistor 219 is conductive. In one embodiment, Vneg is regulated at −9 Volts when transistor 219 is non conductive and −8 Volts when transistor 219 is conductive. Transistor 219 is used to reduce the resistance of path 211.

Some embodiments do not include transistor 219, resistor 213 and level shifter 223. However other embodiments may include additional bypass paths (not shown) for providing additional selectable final negative voltage levels. In such embodiments, an additional resistor (not shown) would be located between node 212 and resistor 213 and a bypass transistor (not shown) would have one current terminal connected to node 212 and the other current terminal connected to the node between resistor 213 and the additional resistor. The gate of the additional transistor would be controlled by a level shifter (not shown) similar to level shifter 223.

Control circuit 227 includes an output for providing the ENABLE signal to charge pump 207. In one embodiment, control circuit 227 is located in a contiguous location in an integrated circuit, but in other embodiments, may be distributed in different locations in the integrated circuit. In one embodiment, circuit 227 includes logic for implementing functions including a state machine, but may include other types of circuitry and implement other types of functions in other embodiments.

Circuit 201 also includes an intermediate voltage detection circuit 209 for providing an indication (IV) of when Vneg has reached an intermediate negative voltage level. In one embodiment, this indication is provided by an SR latch that latches at the first occasion that the PUMP signal transitions to a non asserted state after the ENABLE signal has been asserted.

Figure 3:
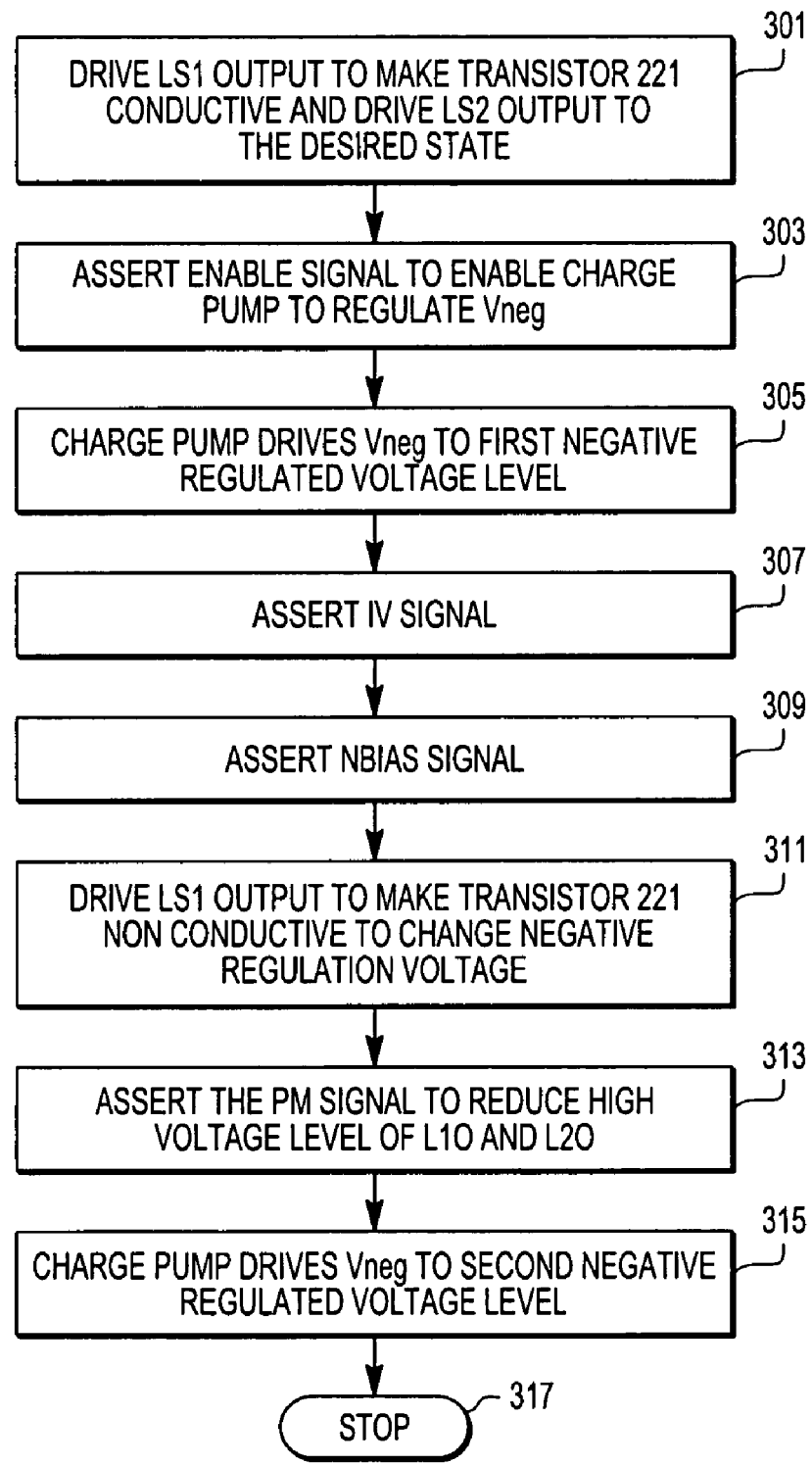
FIG. 3 is a flow diagram according to one embodiment of the present invention.

FIG. 3 is a flow diagram setting forth the operation of circuit 201 for biasing Vneg from 0 volts to an intermediate regulated negative voltage level, and then to a final regulated negative voltage level. In operation 301, transistor 221 is placed in a conductive state. This is accomplished by circuit 227 driving L1 to a lower logic voltage level (0 Volts) which drives signal L1O to a lower voltage level (Vneg), which is at 0 volts during operation 301. Also at this time, transistor 219 is made either conductive or non conductive depending upon the final desired negative voltage level of Vneg. Transistor 219 is made conducive or non conductive by placing signal L2 at the corresponding logic level to control the output of level shifter 223.

At operation 303, the ENABLE signal is asserted to enable charge pump 207 to begin regulating node 216. Because Vneg is initially at 0 Volts (and transistor 221 is conductive), a positive voltage level appears at node 212 which causes the assertion of the PUMP signal by comparator 205. Accordingly, in operation 305, charge pump 207 reduces the potential at node 216 to lower the voltage level of Vneg. When Vneg reaches the desired intermediate negative voltage level (as determined by the voltage level of current I1*resistor 217), the voltage level of node 212 drops below ground and comparator deasserts the PUMP signal. When the PUMP signal is first deasserted after the ENABLE signal has been asserted, circuit 209 asserts the IV signal indicating to control circuit 227 that the desired intermediate negative voltage level has been reached in operation 307. In one embodiment, the intermediate negative voltage level is −4 Volts, but other voltage levels maybe used in other embodiments.

In operation 309, control circuit 227 asserts the NBIAS signal to the level shifters 223 and 225. As will be discussed below, the NBIAS signal is used to enable protection circuitry of the level shifters to limit the impact ionization current in cascoded transistors due to Vneg being reduced from 0 volts to the intermediate negative voltage level.

In operation 311, transistor 221 is changed from a conductive state to a non conductive state. This is accomplished by changing the logic voltage level of signal L1 from a low logic voltage level (e.g. 0 Volts) to a high logic voltage level (e.g. 3.3 volts). The transition of signal L1 from a low logic voltage level to a high logic voltage level causes the output of level shifter 225 to transition from a low logic voltage level to a high logic voltage level to make transistor 221 non conductive. In one embodiment, the low logic voltage level of output L1O at this point is the intermediate negative voltage level (Vneg) and the high logic voltage level is 3.3 Volts. As will be discussed later, in one embodiment, level shifters 225 and 223 include protection circuitry that enable the circuit to perform a change in state after the intermediate negative voltage level has been reached without damaging transistors of the level shifter.

In a short time period after transistor 221 has been made non conductive, circuit 227 asserts the PM signal to lower the high logic voltage level of the output (L1O and L2O) of the level shifters from a higher voltage level (e.g. 3.3 volts) to a lower voltage level (e.g. 0 volts) without changing the conductive states of transistor 221 and 219. This shift will enable the level shifters 223 and 225 to tolerate a subsequently generated more negative Vneg.

Because transistor 221 was made non conductive in operation 311, the voltage drop from node 212 to node 216 is increased significantly due to the increased resistance in path 211 from resistor 215 (and from resistor 213 if transistor 219 is non conductive). Accordingly, the voltage level of node 212 rises thereby causing the assertion of the PUMP signal by comparator 205. Consequently, charge pump 207 drives the voltage level of node 216 further negative in operation 315. The final regulated voltage of Vneg depends upon whether transistor 219 is conductive or non conductive in the embodiment shown. At this point, charge pump 207 is activated and deactivated by the PUMP signal to regulate Vneg at the desired negative voltage (e.g. 9 volts).

In some embodiments, the final negative voltage level may be a higher negative voltage level than the intermediate negative voltage level. With some embodiments, resistance would be removed from path 211 by bypass transistors (not shown) after the intermediate negative voltage is reached. Current leakage and current from current source 210 would be used to pull the voltage level of Vneg higher to a less negative voltage level before charge pump 207 would be reactivated to remove potential from node 216.

In the embodiment of FIG. 2, because level shifters 225 and 223 are able to change states when Vneg is at the intermediate negative voltage level (e.g. −4 volts), circuit 201 is able to regulate Vneg at both the intermediate negative voltage level and the final negative voltage level without having to utilize a separate negative voltage source for additional level shifter transistor protection. With the embodiment shown, negative voltage regulation at different voltage levels is obtainable using the same current path 211. Furthermore, because the level shifters are able to change states at an intermediate negative voltage level, it enables circuit 201 to provide the negative supply voltage with transistors that are not necessarily built to handle the entire voltage swing.

Figure 4:
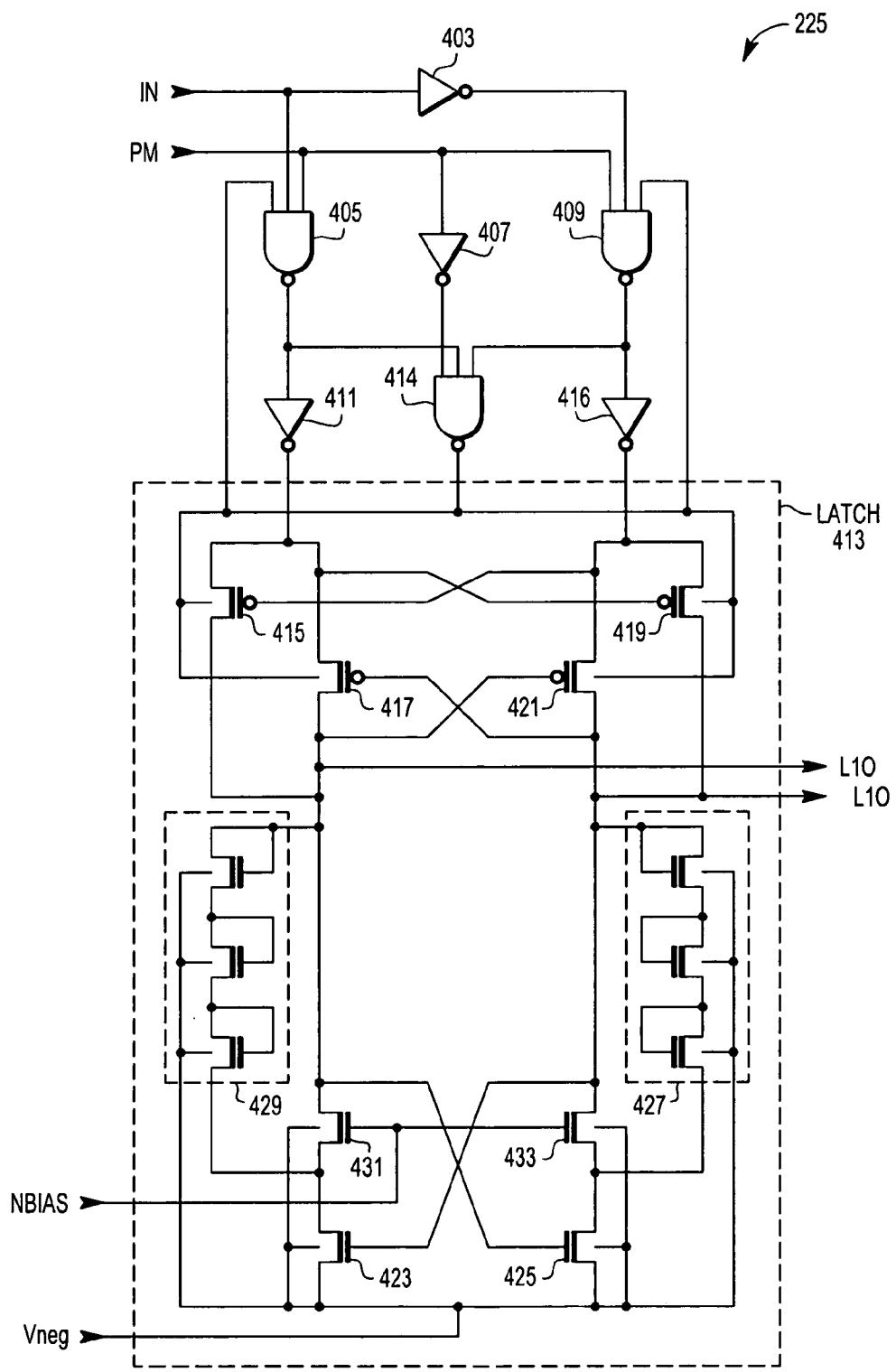
FIG. 4 is a circuit diagram of a level shifter according to one embodiment of the present invention.

FIG. 4 is a circuit diagram of a level shifter 225 according to one embodiment of the present invention. In some embodiments, level shifter 223 may be of a similar design. Similar to level shifter 101, level shifter 225 includes inverters 403, 407, 411, and 416, NAND gates 405, 409, and 414, P-channel transistors 415, 417, 419, and 421, and N-channel transistors 423 and 425. P-channel transistors 415, 417, 419, and 421, and N-channel transistors 423 and 425 form a latch circuit 413. Transistors 423 and 425 are cross coupled. Inverters 403, 407, 411, and 416 and NAND gates 405, 409, and 414 forms an input circuit. In addition, circuit 413 includes cascoded transistors 431 and 433 and stacks 429 and 427 of transistor configured gate diodes for providing the ability to clamp the source to drain voltages of transistors 431 and 433 during a logic switching event of the level shifter.

In operation, level shifter 225 receives an input signal (L1) at a data input and latches the logic state of that signal at its output (L1O). In one example, signal L1 has a voltage signal range of 0 to 3.3V and output signal L1O has a voltage signal range of Vneg to 3.3 Volts. In a level shifting mode (where the PM signal is at a high voltage level (e.g. 3.3 Volts)), signal L1 being at a high logic voltage level or a low logic voltage level causes the output of one of inverters 411 or 416 to be driven to a high logic voltage level (e.g. 3.3. volts) and the output of the other to a low logic voltage level (e.g. 0 Volts). If the output of inverter 411 is at a high logic voltage level, it drives the sources of transistors 415 and 417 and the gate of P-channel transistor 419 at the high logic voltage level. At these voltages, transistor 415 is in a conductive mode and transistors 421 and 419 are is in a non conductive mode. Transistor 415 being conductive overdrives transistors 431 and 423 thereby causing transistor 425 to become conductive to pull down the inverted output (*L1O) to the low logic voltage level. *L1O being at the low logic voltage level further makes conductive transistor 417 and further ensures that transistor 421 is non conductive. With transistor 417 being conductive, L1O is pulled to the high logic voltage level (e.g. 3.3 volts). Latch circuit 413 would provide the opposite logic voltage levels at L1O and *L1O if the output of inverter 416 was at the high logic voltage level and the output of inverter 411 was at the low logic voltage level.

In operation 301, signal L1 is provided at the lower logic voltage level (0 Volts), which drives L1O at its corresponding low logic voltage level of 0 volts to make transistor 221 conductive. During operation 301, the NBIAS signal is at its non asserted state of the high logic voltage level (3.3.volts) and the PM signal is at its non asserted state of the high logic voltage level (3.3 volts).

With the activation of the charge pump 207 in operation 303, Vneg drops from 0 volts to the intermediate negative voltage level (e.g. –4 volts). Level shifter 225 is designed such that the low logic voltage level of signal L1O follows Vneg from 0 volts to the intermediate negative voltage level (Vneg) with the drop in Vneg. Accordingly, at operation 303, the low voltage level of signal L1O drops while still biasing transistor 221 as conductive.

When Vneg reaches the intermediate negative voltage level (e.g. –4 volts), the IV signal is asserted. Afterwards, the NBIAS signal is asserted to a low logic voltage level (e.g. 0 volts) to enable stacks 427 and 429 operate to reduce impact ionization in transistors 431 and 433 (depending on the state of latch circuit 413).

When the NBIAS signal is asserted at the low logic voltage level, the channel resistance of transistors 431 and 433 increases. This causes a lower voltage field between the pinch off voltage and the drain voltage of these transistors which reduces the impact ionization during the conduction state of the transistors.

For example, just prior to operation 309, L1O is at the low logic voltage level (Vneg), transistors 421, 419, 423, and 431 are conductive, and transistors 415, 417, and 425 are non conductive. Transistor 433 is also non conductive because its source is at a high potential with respect to its gate. When the NBIAS signal is asserted low, no transistors change state but the resistance of transistors 431 and 433 increase.

In operation 311, the state of L1O signal is driven from a low voltage level (Vneg) to a high voltage level (e.g. 3.3. volts) to switch the conductivity state of transistor 221. If Vneg is –4 volts, this switch results in over a 7 volt swing in L1O.

As stated above, level shifter 225 includes stacks 429 and 427 along with cascoded transistors 431 and 433 so that this voltage swing does not damage the N-channel transistors in latch circuit 413.

During a switch in output state of L1O from a low voltage level (Vneg) to a high voltage level (3.3 Volts) in operation 311, the output of inverter 411 goes to 3.3 volts and the output of inverter 416 goes to 0 volts. With NBIAS being at a low voltage level, transistor 431 has a higher resistance than when the NBIAS signal is non asserted, thereby allowing more current to be diverted through diode stack 429 for protecting transistor 431 from impact ionization. Also, increasing the resistance of transistor 431 allows the 3.3. volts at the output of inverter 411 to more easily drive L1O high by reducing the current through transistors 431 and 423. Pulling L1O high increases the gate voltage on the gate of transistor 425 making it more conductive. This acts to decrease the gate voltage of transistor 423 to turn that transistor off. Accordingly, the increased resistance of 431 due to the assertion of the NBIAS signal increases the resistance of the path of transistor 431 and allows the output of inverter 411 to more easily pull up the node against Vneg, providing the L1O signal.

After the state of transistor 221 is changed to a non conductive state, charge pump 207 begins to drive Vneg further negative. To protect level shifter 225 during from such a wide voltage drop (e.g. 12 volts in some embodiments), the PM signal is asserted (asserted low) to reduce the high voltage level of signal L1O from 3.3 volts to 0 Volts without changing the logic state of signal L1O. The assertion of the PM signal (to 0 Volts) causes the outputs of NAND gates 405 and 409 and inverter 407 to be driven to the high logic voltage level (3.3.volts). This causes NAND gate 414 to be driven to a low logic voltage level (0 Volts). The voltage levels of the outputs of inverters 411 and 416 (and particular inverter 411) going to a low logic voltage level (3.3 volts to 0 volts) causes the high voltage level of signal L1O to be pulled to a lower voltage level (3.3. volts to 0 volts) without changing the state of signal L1O.

Also, since the output of gate 414 is tied to the N well regions of transistors 415, 417, 419, and 421, that output going to 0 volts from 3.3 volts limits the gate to well voltage and gate to source voltage for those transistors to no greater than 9 volts (particular transistor 421 since its gate will be at Vneg at the end of operation 315).

The output of gate 414 is connected to inputs of gates 405 and 409 so that the well region of transistors 415, 417, 419, and 421 are driven back to 3.3 volts before the sources of any of those transistors are driven to the higher voltage level.

In one embodiment, a method includes providing at a first output of a level shifter, a first logic state at a first output voltage level that selects a first negative regulation voltage level in response to the first logic state. The method includes generating a negative supply voltage that begins at a first supply voltage level and decreases to the first negative regulation voltage level. The method includes switching the first output of the level shifter from the first logic state to a second logic state in response to the negative supply voltage reaching the first negative regulation voltage level. The second logic state is provided at a second output voltage level that selects a second negative regulation voltage level. The method also includes adjusting the negative supply voltage from the first negative regulation voltage level to the second negative regulation voltage level in response to the switching.

In another embodiment, a level shifter includes a negative voltage supply terminal. The level shifter also includes a first N channel transistor having a source connected to the negative voltage supply terminal, and a gate, and a drain. The level shifter includes a second N channel transistor having a source connected to the negative voltage supply terminal, and a gate, and a drain. The level shifter includes a third N channel transistor having a gate for receiving a bias signal, a source connected to the drain of the first N channel transistor, and a drain connected to the gate of the second N channel transistor. The drain is connected to a first output of the level shifter. The level shifter includes a fourth N channel transistor having a gate for receiving the bias signal, a source connected to the drain of the second N channel transistor, and a drain connected to the gate of the first N channel transistor. The drain is connected to a second output of the level shifter. The level shifter includes at least one diode-connected N channel transistor coupled in parallel with the third N channel transistor and at least one diode-connected N channel transistor coupled in parallel with the fourth N channel transistor.

In another embodiment, a level shifter includes an input for receiving a data signal, a second input for receiving a control signal, a first output coupled to a first intermediate node, a second output coupled to a second intermediate node, and a first circuit. The first circuit is responsive to the first and second intermediate nodes and to a negative supply voltage for providing at the first output at a logic state that is one of a logic low or the logic high. The logic state is representative of the data signal. The logic low is provided by coupling a voltage applied to sources of a first N channel transistor and a second N channel transistor that are cross coupled. The level shifter includes impact ionization circuit, coupled to the first and second N channel transistors, for preventing damage to the first and second N channel transistors due to impact ionization during a logic state change on the first output.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method, comprising:
providing at a first output of a level shifter, a first logic state at a first output voltage level that selects a first negative regulation voltage level in response to the first logic state;
generating a negative supply voltage that begins at a first supply voltage level and decreases to the first negative regulation voltage level;
switching the first output of the level shifter from the first logic state to a second logic state in response to the negative supply voltage reaching the first negative regulation voltage level, wherein the second logic state is provided at a second output voltage level that selects a second negative regulation voltage level;
adjusting the negative supply voltage from the first negative regulation voltage level to the second negative regulation voltage level in response to the switching.

2. The method of claim 1 further comprising after the switching, reducing at the first output of the level shifter, a voltage of the second logic state from the second output voltage level to a third output voltage level.

3. The method of claim 1, further comprising supplying the negative supply voltage at the second negative regulation voltage level to a memory for erasing cells of the memory.

4. The method of claim 1, wherein the second negative regulation voltage level is less than or equal to minus eight volts.

5. The method of claim 1, wherein:
the level shifter includes a first N channel transistor;
the method further comprising:
protecting the first N channel transistor from impact ionization during the step of switching the first output.

6. The method of claim 1, wherein:
the level shifter includes a first N channel transistor that switches conductive states during the switching;
the level shifter includes a second N channel transistor in series with the first N channel transistor;
during the providing the first logic state at the first output voltage level, the second N channel transistor is at a conductive state of a first resistive level;
the method further comprising prior to the switching, changing a resistive level of the conductive state of the second N channel transistor from the first resistive level to a second resistive level, the second resistive level is higher than the first resistive level.

7. The method of claim 6 wherein a first stack of diode-connected transistors is connected in parallel with the second N channel transistor.

8. The method of claim 1 wherein during the generating, the first output voltage level at the first output of the level shifter decreases as the negative supply voltage decreases.

9. The method of claim 1 wherein the second negative regulation voltage level is less than first negative regulation voltage level.

10. The method of claim 1 wherein:
the generating a negative supply voltage includes generating the negative supply voltage at a first node, the first node is coupled to an output of a negative charge pump, the negative charge pump includes an input coupled to an output of a comparator circuit, the comparator circuit including a first input coupled to a reference potential and a second input coupled to a second node, a plurality of resistive elements is coupled in series between the first node and the second node;
the method further comprises:
enabling a bypass path to bypass a first resistive element of the plurality of resistive elements between the second node and the first node in response to the providing the first logic state at the first output,
disabling the bypass path in response to the switching.

11. A level shifter, comprising:
a negative voltage supply terminal;
a first N channel transistor having a source connected to the negative voltage supply terminal, and a gate, and a drain;
a second N channel transistor having a source connected to the negative voltage supply terminal, and a gate, and a drain;
a third N channel transistor having a gate for receiving a bias signal, a source connected to the drain of the first N channel transistor, and a drain connected to the gate of the second N channel transistor, wherein the drain is connected to a first output of the level shifter;
a fourth N channel transistor having a gate for receiving the bias signal, a source connected to the drain of the second N channel transistor, and a drain connected to the gate of the first N channel transistor, wherein the drain is connected to a second output of the level shifter;

at least one diode-connected N channel transistor coupled in parallel with the third N channel transistor; and at least one diode-connected N channel transistor coupled in parallel with the fourth N channel transistor.

12. The level shifter of claim 11, further comprising an input circuit having a data signal input for receiving a data signal, a control signal input for receiving a control signal, a first output coupled to the drain of the third N channel transistor, and a second output coupled to the drain of the fourth N channel transistor.

13. The level shifter of claim 12, further comprising:

a first P channel transistor having a source coupled to a first intermediate node, a gate coupled to a second intermediate node, and a drain coupled to the drain of the third N channel transistor; and a second P channel transistor having a source coupled to the second intermediate node, a gate coupled to the first intermediate node, and a drain coupled to the drain of the fourth N channel transistor.

14. The level shifter of claim 13 further comprising:

a third P channel transistor having a source coupled to a first intermediate node, a gate coupled to the drain of the fourth N channel transistor, and a drain coupled to the drain of the third N channel transistor; and a fourth P channel transistor having a source coupled to the second intermediate node, a gate coupled to the drain of the third N channel transistor, and a drain coupled to the drain of the fourth N channel transistor.

15. The level shifter of claim 14, wherein the input circuit further comprises:

a voltage supply change circuit coupled between the data signal input and the first and second intermediate nodes.

16. The level shifter of claim 15, wherein the input circuit is further characterized by the voltage supply change circuit being coupled between the control signal input and the first and second intermediate nodes.

17. The level shifter of claim 16, wherein the voltage supply change circuit is further characterized as being a circuit for changing a voltage being supplied as a logic high output.

18. The level shifter of claim 14 wherein the input circuit comprises:

a first logic gate having an input coupled to the data signal input, and an output; and a first inverter having an input coupled to the output of the first logic gate, and an output coupled to the first intermediate node.

19. The level shifter of claim 18 wherein the input circuit further comprises:

a second logic gate having an input coupled to the output of the first logic gate, and an output coupled to an N well region of each of the first P channel transistor, the second P channel transistor, the third P channel transistor, and the fourth P channel transistor.

20. A level shifter, comprising:

an input for receiving a data signal;

a second input for receiving a control signal;

a first output coupled to a first intermediate node;

a second output coupled to a second intermediate node;

a first circuit, the first circuit responsive to the first and second intermediate nodes and to a negative supply voltage for providing at the first output at a logic state that is one of a logic low or the logic high, wherein the logic state is representative of the data signal, wherein the logic low is provided by coupling a voltage applied to sources of a first N channel transistor and a second N channel transistor that are cross coupled; and impact ionization circuit, coupled to the first and second N channel transistors, for preventing damage to the first and second N channel transistors due to impact ionization during a logic state change on the first output.

* * * * *